(12) United States Patent
Yang et al.

(10) Patent No.: US 7,629,682 B2
(45) Date of Patent: Dec. 8, 2009

(54) WAFER LEVEL PACKAGE CONFIGURED TO COMPENSATE SIZE DIFFERENCE IN DIFFERENT TYPES OF PACKAGES

(75) Inventors: Seung Taek Yang, Seoul (KR); Qwan Ho Chung, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 342 days.

(21) Appl. No.: 11/647,622

(22) Filed: Dec. 29, 2006

(65) Prior Publication Data
US 2008/0122062 A1 May 29, 2008

(30) Foreign Application Priority Data
Nov. 8, 2006 (KR) ............... 10-2006-0110145

(51) Int. Cl.
H01L 23/12 (2006.01)
H01L 21/00 (2006.01)

(52) U.S. Cl. .............. 257/704; 257/707; 257/713; 257/717; 257/720; 257/E23.051; 257/E23.101; 438/122

(58) Field of Classification Search ............ None
See application file for complete search history.

(56) References Cited

U.S. PATENT DOCUMENTS

| 3,972,062 | A | * | 7/1976 | Hopp | ............ 257/778 |
| 4,323,914 | A | * | 4/1982 | Berndlmaier et al. | ....... 257/713 |
| 5,311,402 | A | * | 5/1994 | Kobayashi et al. | .......... 361/760 |
| 6,154,366 | A | * | 11/2000 | Ma et al. | .............. 361/704 |
| 6,271,469 | B1 | * | 8/2001 | Ma et al. | .............. 174/521 |
| 6,294,403 | B1 | * | 9/2001 | Joshi | ........................ 438/106 |
| 7,122,887 | B2 | * | 10/2006 | Standing et al. | ............. 257/690 |
| 7,476,979 | B2 | * | 1/2009 | Standing et al. | ............. 257/782 |
| 7,476,980 | B2 | * | 1/2009 | Rebibis et al. | .............. 257/782 |
| 2005/0202590 | A1 | * | 9/2005 | Huang et al. | ................ 438/106 |
| 2006/0038291 | A1 | * | 2/2006 | Chung et al. | ................. 257/738 |

FOREIGN PATENT DOCUMENTS

| CN | 1246731 A | 3/2000 |
| CN | 1493088 A | 4/2004 |
| KR | 1020050074251 | 7/2005 |
| KR | 1020060058954 | 6/2006 |

* cited by examiner

Primary Examiner—Alonzo Chambliss
(74) Attorney, Agent, or Firm—Ladas & Parry LLP

(57) ABSTRACT

A wafer level package including a semiconductor chip having a plurality of bonding pads on a front surface thereof; a lower insulation layer formed on the semiconductor chip to expose the bonding pads; re-distribution lines formed on the lower insulation layer to be connected to the bonding pads at first ends thereof; an upper insulation layer formed on the lower insulation layer including the re-distribution lines, with portions of the re-distribution lines exposed; solder balls attached to the exposed portions of the re-distribution lines; and a cap covering a rear surface of the semiconductor chip.

7 Claims, 3 Drawing Sheets

WAFER LEVEL PACKAGE CONFIGURED TO COMPENSATE SIZE DIFFERENCE IN DIFFERENT TYPES OF PACKAGES

CROSS-REFERENCE TO RELATED APPLICATIONS

The present application claims priority to Korean patent application number 10-2006-0110145 filed on Nov. 8, 2006, which is incorporated herein by reference in its entirety.

BACKGROUND OF THE INVENTION

The present invention relates to a wafer level package, and more particularly, to a wafer level package which is configured to compensate for a difference in size between a wafer level package and an FBGA (fine-pitch ball grid array) package.

In general, a package is manufactured by cutting a wafer into individual semiconductor chips and conducting a packaging process for each semiconductor chip. However, the packaging process includes by itself a number of unit processes such as die attaching, wire bonding, molding, trimming, forming, and so forth. Thus, in a conventional package manufacturing method in which the packaging process should be conducted for every semiconductor chip, a problem occurs in that, when considering the number of semiconductor chips obtained from one wafer, a time required for packaging all the semiconductor chips is too long.

In order to cope with this problem, recently, a method has been disclosed in the art, in which a packaging process is first conducted in the state of a wafer and the wafer is cut into individual packages to form a plurality of packages. A package manufactured in this way is called a wafer level package.

In the wafer level package, the re-distribution of pads through a re-distribution process must be necessarily performed, and therefore, the insertion of a buffer layer for alleviating a stress must be necessarily implemented.

Nevertheless, while the wafer level package has advantages in terms of processes, it has disadvantages as described below, so it is difficult to manufacture a wafer level package.

First, while not illustrated and explained, a wafer level package has solder balls as a mounting means to an outside circuit as in the case of an existing FBGA package. Therefore, since the wafer level package has a ball layout, when subsequently conducting a module process and a test process for the wafer level package, the infra of the existing FBGA package, that is, facilities and techniques which are employed in the module process and the test process for the FBGA package, must be employed as they are. In this regard, since the wafer level package is a different size from the FBGA package, the various techniques for the FBGA package cannot be employed as they are. Accordingly, an extended period is required and there are difficulties to mount and test the wafer level package.

Further, in the wafer level package, while the front surface of the semiconductor chip is covered by an insulation layer, the rear surface of the semiconductor chip is exposed to the outside. Hence, since the wafer level package has a structural limit in that the rear surface of the semiconductor chip is exposed to the outside, the wafer level package is weak to an external shock.

Moreover, as electronic or electric appliances trend toward miniaturization and slimness, the size of a package has decreased. In this regard, as the size of the wafer level package has decreased, the heat dissipation capability thereof has deteriorated, and as a result, the wafer level package has a poor thermal characteristic.

SUMMARY OF THE INVENTION

The embodiments of the present invention is directed to a wafer level package which is configured to compensate for a difference in size between a wafer level package and an FBGA package so that various techniques associated with the FBGA package can be employed as they are.

Also, the embodiments of the present invention may be directed to a wafer level package which can protect a semiconductor chip from an external shock.

Further, the embodiments of the present invention may be directed to a wafer level package which can secure a thermal characteristic even though a size thereof is decreased.

In one embodiment, the wafer level package comprises a semiconductor chip having a plurality of bonding pads on a front surface thereof; a lower insulation layer formed on the semiconductor chip to expose the bonding pads; re-distribution lines formed on the lower insulation layer to be connected to the bonding pads at first ends thereof; an upper insulation layer formed on the lower insulation layer including the re-distribution lines to expose portions of the re-distribution lines; solder balls attached to the exposed portions of the re-distribution lines; and a cap covering a rear surface of the semiconductor chip.

The cap is defined with a groove on a surface thereof which is brought into contact with the semiconductor chip such that the semiconductor chip can be inserted into the groove, and the cap has a size similar to that of the semiconductor chip.

The cap is made of a thermally conductive material, for example, a metal.

The cap and the semiconductor chip are coupled to each other by an adhesive formed of a thermally conductive substance.

The cap and the semiconductor chip are mechanically coupled to each other, such as in a slide type coupling. The cap is defined with a groove on one surface thereof which has a size corresponding to that of the semiconductor chip and is opened on one sidewall thereof, and the semiconductor chip is slidably fit into the groove through the opened sidewall of the cap and is fixedly located in the groove.

DESCRIPTION OF SPECIFIC EMBODIMENTS

In the present invention, the rear surface of a semiconductor chip in an existing wafer level package is covered by a cap having the same size as an FBGA package, and through this, it is possible to compensate for the difference in size between the wafer level package and the FBGA package. Therefore, the wafer level package including the cap according to an embodiment of the present invention has the same overall size as the FBGA package. Hence, in an embodiment of the present invention, when conducting a module process and a test process for the wafer level package, since there are various techniques which are already set up for the FBGA package which can be employed as they are, the module process and the test process can be easily conducted, and required times are significantly shortened.

Also, in the wafer level package including the cap according to an embodiment of the present invention, since the rear surface of the semiconductor chip is encapsulated by the cap, the semiconductor chip can be protected from an external shock and therefore has a characteristic which is resistant to external shock. Further, in the wafer level package including the cap according to an embodiment of the present invention, because a material having excellent thermal conductivity, for example a metal, is adopted as the material for the cap, the heat generated from the semiconductor chip can be quickly dissipated to the outside through the cap. Thus, even though the size of the wafer level package is decreased, the wafer level package can have an excellent thermal characteristic.

Hereafter, the wafer level package in accordance with an embodiment of the present invention will be described with reference to the attached drawings.

Figure 1:
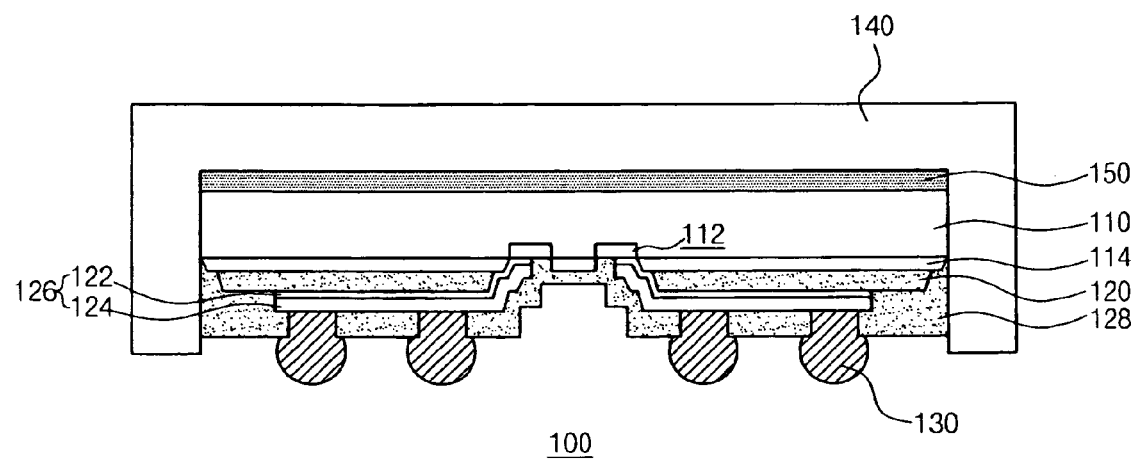
FIG. 1 is a cross-sectional view illustrating a wafer level package in accordance with an embodiment of the present invention.

FIG. 1 is a cross-sectional view illustrating a wafer level package in accordance with an embodiment of the present invention. The wafer level package 100 includes a semiconductor chip 110 which has a plurality of bonding pads 112 on the front surface thereof, re-distribution lines 126 which are formed on the front surface of the semiconductor chip 110 to be connected with the bonding pads 112 on first ends thereof, solder balls 132 which are attached to portions of the re-distribution lines 126, and a cap 140 which covers the rear surface of the semiconductor chip 110.

On the front surface of the semiconductor chip 110, the remaining portion excluding the bonding pads 112 are covered by a protective layer 114. A lower insulation layer 120 is interposed between the semiconductor chip 110 including the protective layer 114 and the re-distribution lines 126 to expose the bonding pads 112. An upper insulation layer 128 is formed on the lower insulation layer 120 including the re-distribution lines 126 to expose portions of the re-distribution lines 126. The re-distribution lines 126 comprise a stacked layer of a seed metal layer 122 and a wiring metal layer 124. An adhesive 150 is interposed between the semiconductor chip 110 and the cap 140. By the adhesive 150, the semiconductor chip 110 and the cap 140 are physically coupled to each other. Preferably, the adhesive 150 is formed of an adhesive substance having excellent thermal conductivity.

Figure 2:
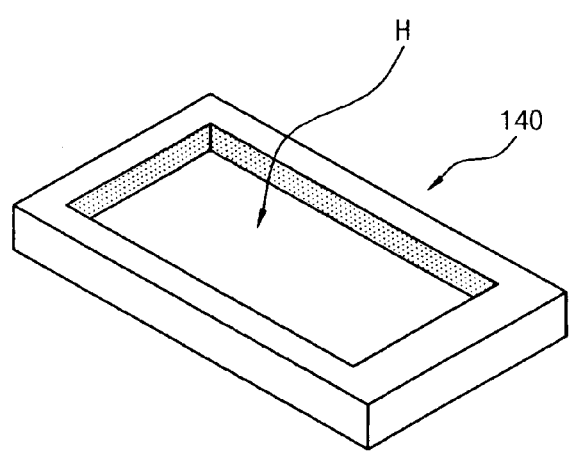
FIG. 2 is a perspective view illustrating a cap in accordance with an embodiment of the present invention.

The cap 140 is formed to have the same overall size as an FBGA package. As shown in FIG. 2, a groove H is defined on the surface of the cap 140 which faces the rear surface of the semiconductor chip 110. At this time, the groove H is defined to have the same or similar size as the semiconductor chip 110. Since the cap 140 is approximately the same size as the FBGA package, the various techniques employed in the module process and the test process of the existing FBGA package can be employed as they are.

Further, as the cap 140 encapsulates the rear surface of the semiconductor chip 110, the semiconductor chip 110 is prevented from being exposed to the outside. Therefore, the cap 140 functions to prevent the semiconductor chip 110 from being damaged by an external shock. Thus, the wafer level package 100 according to the present invention has a characteristic which is resistant to an external shock.

The cap 140 is made of a material having excellent thermal conductivity, for example, a metal. Accordingly, since the cap 140 is brought into contact with the rear surface of the semiconductor chip 110 via the adhesive 150 having excellent thermal conductivity, the cap 140 serves as a heat sink for quickly dissipating the heat generated by the semiconductor chip 110 to the outside. Hence, the wafer level package 100 according to the present invention has an excellent heat dissipation characteristic.

Figure 3A:
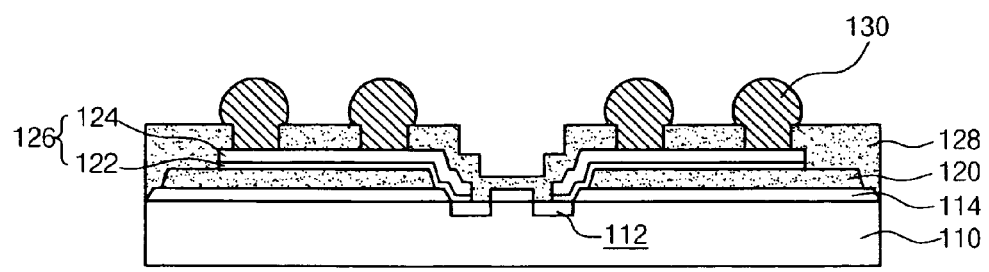
FIGS. 3A and 3B are cross-sectional views illustrating a manufacturing procedure of the wafer level package in accordance with an embodiment of the present invention.
Figure 3B:
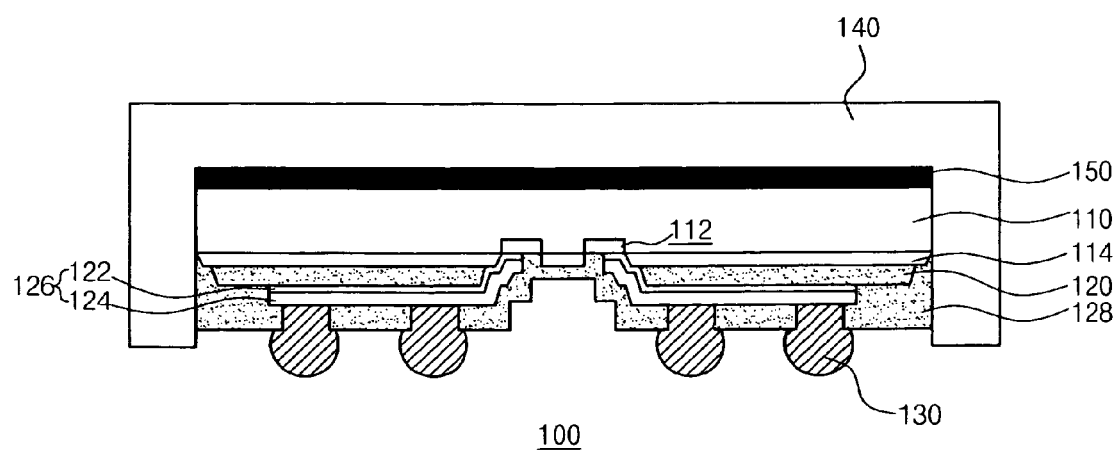

FIGS. 3A and 3B are cross-sectional views illustrating a manufacturing procedure for the wafer level package in accordance with an embodiment of the present invention.

Referring to FIG. 3A, a semiconductor chip 110, which has a plurality of bonding pads 112 on the front surface thereof and is covered by a protective layer 114 on the remaining portion excluding the bonding pads 112, is prepared. A lower insulation layer 120 is formed on the front surface of the semiconductor chip 110 with the protective layer 114 formed therebetween, and with the bonding pads 112 exposed. By performing a pad re-distribution process, a plurality of re-distribution lines 126 are formed on the lower insulation layer 120, such that the first ends of the re-distribution lines 126 are connected to the exposed bonding pads 112 and the re-distribution lines 126 comprise the stacked layers of a seed metal layer 122 and a wiring metal layer 124. An upper insulation layer 128 is formed on the lower insulation layer 120 including the re-distribution lines 126 to expose portions of the re-distribution lines 126. Solder balls 130 are attached to the exposed portions of the re-distribution lines 126 as mounting means to an outside circuit.

Referring to FIG. 3B, a cap 140 is installed to encapsulate the rear surface of the semiconductor chip 110 via an adhesive 150 having thermal conductivity, and as a result, the manufacture of the wafer level package 110 according to the present invention is completed. Here, the cap 140 is prepared to have the same overall size as an FBGA package. Also, the cap 140 is defined with a groove H on the surface thereof which is brought into contact with the semiconductor chip 110. The groove H is approximately the same size as the semiconductor chip 110. As a consequence, the wafer level package 100 according to the present invention has a configuration in which the semiconductor chip 110 is received in the groove H of the cap 140.

Thereafter, while not shown in the drawings, a test is performed for the wafer level package 100, or the wafer level package 110 is mounted to a mother board to constitute a module. At this time, since the wafer level package 100 of an embodiment of the present invention has the same overall size as the existing FBGA package, when conducting the test and module processes, the facilities and process techniques of the FBGA package, which have already set up for the module and test processes, can be employed as they are.

Meanwhile, although the above-described embodiment exemplifies an adhesive type coupling in which the semiconductor chip 110 and the cap 140 are coupled to each other by the adhesive 150, it is to be readily understood that they can be mechanically coupled to each other, for example, in a slide type coupling.

Figure 4:
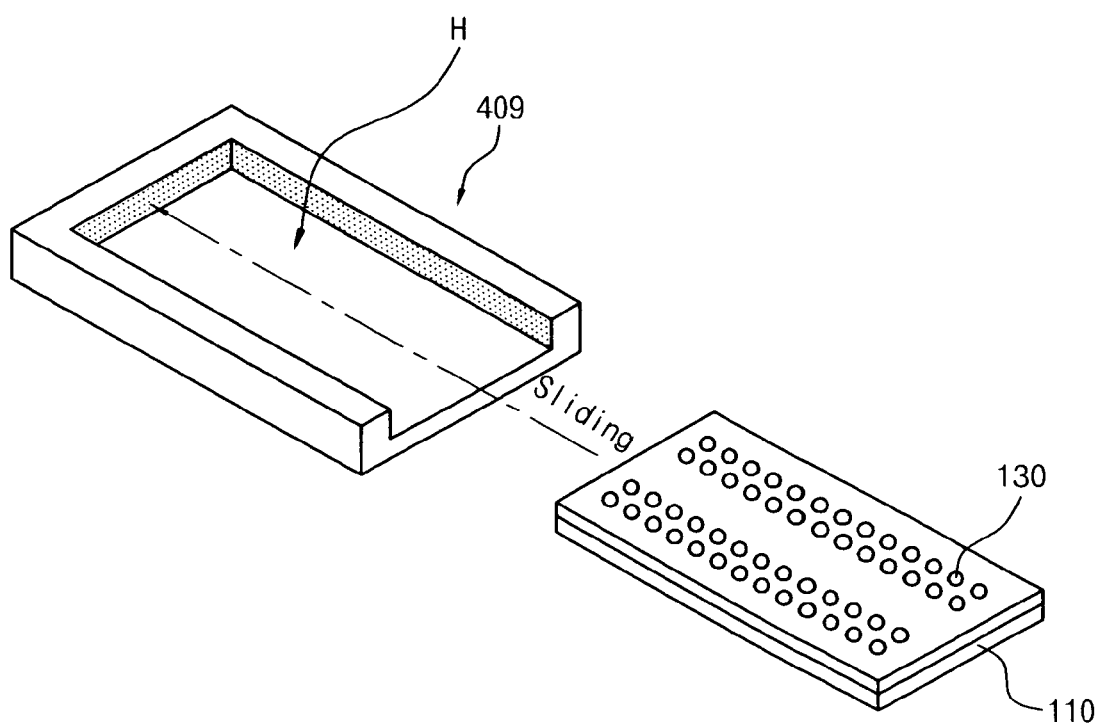
FIG. 4 is a view illustrating a slide type coupling between a cap and a semiconductor chip.

FIG. 4 is a view illustrating a coupling relationship between a semiconductor chip and a cap in a slide type coupling. A semiconductor chip 110, which has undergone a pad re-distribution process and a solder ball attachment process, is slid into the groove H of a cap 409 and is fixedly located in the groove H.

In this coupling pattern, the cap 409 is defined with a groove H which has a size corresponding to that of the semiconductor chip 110 and is opened on one sidewall thereof. The semiconductor chip 110 is slid through the opened sidewall of the cap 409 and is fixedly located in the groove H of the cap 409. At this time, the front and rear walls of the cap 409, which face each other and are perpendicular to the opened sidewall, serve as guides for guiding sliding movement of the semiconductor chip 110. As the occasion demands, guide projections or guide grooves may be additionally formed or defined on the front and rear walls of the cap 409.

In the above-described embodiment, the wafer level package having the cap installed thereon is mounted to a mother board to construct a module. However, in another embodiment of the present invention, after a wafer level package is mounted to a mother board with a cap not installed on the wafer level package, the cap can be installed to cover the rear surface of a semiconductor chip.

Also, while the wafer level package, on which the cap having approximately the same size as an FBGA package is installed, was illustrated and described in the above embodiment, it can be envisaged that the cap is installed on other packages such as a flip-chip package, which uses solder balls as a mounting means, so that a module process and a test process can be conducted using the various techniques of the FBGA package.

In addition, since the cap can be manufactured to conform to the sizes of various packages, the cap can be applied to all conventional packages which are widely used, and a module process and a test process for a corresponding package can be conducted using the infra of a module process and a test process for another package.

As is apparent from the above description, in an embodiment of the present invention, a wafer level package may be realized in a manner such that a cap having approximately the same size as an FBGA package is installed to cover the rear surface of a semiconductor chip. Therefore, in the present invention, since it may be possible to compensate for the difference in size between an existing wafer level package and an FBGA package, when conducting a module process and a test process for the wafer level package, the infra of the FBGA package can be employed as it is, and thereby, required time and cost saving may be realized.

Moreover, since the wafer level package according to an embodiment of the present invention has a configuration in which the cap covers the rear surface of the semiconductor chip, the semiconductor chip can be protected from external shock. Thus, the present invention realizes a wafer level package which has an excellent mechanical characteristic.

Furthermore, in an embodiment of the present invention, because a material having excellent thermal conductivity, such as a metal, may be adopted as the material for the cap, the heat dissipating characteristic for the semiconductor chip can be improved. Therefore, even with the trend in which the size of a package is decreased, a wafer level package having a stable heat dissipation characteristic can be realized.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A wafer level package comprising:
   a semiconductor chip having a plurality of bonding pads on a front surface thereof;
   a lower insulation layer formed on the semiconductor chip which expose the bonding pads;
   re-distribution lines formed on the lower insulation layer to be connected to the bonding pads at first ends thereof;
   an upper insulation layer formed on the lower insulation layer including the re-distribution lines, with portions of the re-distribution lines exposed;
   solder balls attached to the exposed portions of the re-distribution lines; and
   a cap covering a rear surface of the semiconductor chip,
   wherein the cap and the semiconductor chip are mechanically coupled to each other, and the cap and the semiconductor chip are coupled to each other by a slide type coupling, and
   wherein the cap is defined with a groove on one surface thereof an plurality of sidewalls, wherein the groove has a similar size to that of the semiconductor chip and is opened on only one sidewall thereof, and the semiconductor chip is slidably fitted into the groove through the opened sidewall of the cap and is fixedly located in the groove.

2. The package according to claim 1, wherein the cap has a groove on a surface thereof which is brought into contact with the semiconductor chip such that the semiconductor chip can be inserted into the groove.

3. The package according to claim 2, wherein the cap is similar in size to that of the semiconductor chip.

4. The package according to claim 1, wherein the cap is made of a thermally conductive material.

5. The package according to claim 4, wherein the cap is made of a metal.

6. The package according to claim 1, wherein the cap and the semiconductor chip are coupled to each other by an adhesive.

7. The package according to claim 5, wherein the adhesive is formed of a thermally conductive substance.

* * * * *